(12) United States Patent
Vitacolonna et al.

(10) Patent No.: US 9,696,396 B2
(45) Date of Patent: Jul. 4, 2017

(54) ACQUISITION OF MR DATA WITH SEQUENTIAL SELECTION OF RESONANT MODES OF THE RF COIL ASSSEMBLY

(75) Inventors: Assunta Vitacolonna, L'aquila (IT); Angelo Galante, L'aquila (IT); Marcello Alecci, L'aquila (IT)

(73) Assignee: Universita' Degli Studi Dell' Aquila, L'aquila (IT)

( * ) Notice: Subject to any disclaimer, the term of this patent is extended or adjusted under 35 U.S.C. 154(b) by 636 days.

(21) Appl. No.: 14/115,676

(22) PCT Filed: May 30, 2012

(86) PCT No.: PCT/IT2012/000159
§ 371 (c)(1),
(2), (4) Date: Nov. 5, 2013

(87) PCT Pub. No.: WO2012/164595
PCT Pub. Date: Dec. 6, 2012

(65) Prior Publication Data
US 2014/0062482 A1     Mar. 6, 2014

(30) Foreign Application Priority Data
May 30, 2011   (IT) .............................. RM2011A0266

(51) Int. Cl.
*G01R 33/34*       (2006.01)
*G01R 33/36*       (2006.01)
(Continued)

(52) U.S. Cl.
CPC ..... *G01R 33/3635* (2013.01); *G01R 33/3415* (2013.01); *G01R 33/3664* (2013.01);
(Continued)

(58) Field of Classification Search
CPC .................. G03R 33/32–33/34007; G03R 33/34046–33/34084;
(Continued)

(56) References Cited

U.S. PATENT DOCUMENTS 6,081,120 A    6/2000 Shen
6,975,114 B1  12/2005 Ledden
(Continued)

FOREIGN PATENT DOCUMENTS

WO    2005111645 A2    11/2005
WO    2009105701 A1     8/2009

OTHER PUBLICATIONS

J.P. Hornak, Basics of MRI. Excerpt from Chapter 9, p. 4/12.*
(Continued)

*Primary Examiner* — Clayton E Laballe
*Assistant Examiner* — Ruifeng Pu
(74) *Attorney, Agent, or Firm* — Thomas Horstemeyer, LLP

(57) ABSTRACT

A method (10) for acquiring magnetic resonance data from a sample (50) to be analyzed through a fixed geometry configuration coil suitable for transmitting radiofrequency signals 'suitable for exciting said sample and/or detecting magnetic resonance signals from the sample (50) is described. The coil (100) comprises a plurality of current elements (20,21,22) and exhibits a frequency response comprising a plurality of resonant modes (M1, M2, M3) each associable to a respective resonant frequency (f1,f2,f3) depending on electrical features of the current elements (20,21,22), the current elements (20,21,22) comprising at least one current element having electrical features that may be regulated based on a respective control signal (S_CV0, S_CV1, S_CV2). The method provides for synthesizing the control signal such as to obtain magnetic resonance data (Continued)

from a same sample for a given first resonant frequency of interest sequentially using resonance modes having different spatial field distributions.

23 Claims, 3 Drawing Sheets

(51) Int. Cl.
  *G01R 33/3415* (2006.01)
  *G01R 33/345* (2006.01)
  *G01R 33/565* (2006.01)

(52) U.S. Cl.
  CPC .... *G01R 33/34007* (2013.01); *G01R 33/3456* (2013.01); *G01R 33/5659* (2013.01)

(58) Field of Classification Search
  CPC .................. G03R 33/341–33/3415; G03R 33/36–33/3607; G03R 33/3628–33/3642
  See application file for complete search history.

(56) References Cited

U.S. PATENT DOCUMENTS

| | | | | |
|---|---|---|---|---|
| 8,049,501 | B2* | 11/2011 | Hancu | G01R 33/34061 324/318 |
| 2007/0038068 | A1* | 2/2007 | Leussler | G01R 33/561 600/410 |
| 2007/0285096 | A1* | 12/2007 | Soutome | G01R 33/34046 324/318 |
| 2008/0129296 | A1 | 6/2008 | Fischer et al. | |
| 2009/0096553 | A1 | 4/2009 | Driesel et al. | |
| 2009/0134876 | A1* | 5/2009 | Griswold | G01R 33/3635 324/318 |
| 2009/0237077 | A1* | 9/2009 | Vaughan | G01R 33/3415 324/307 |
| 2009/0251145 | A1* | 10/2009 | Kaneko | G01R 33/34046 324/318 |
| 2010/0253333 | A1* | 10/2010 | Zhai | G01R 33/34046 324/307 |
| 2010/0256481 | A1* | 10/2010 | Mareci | G01R 33/3692 600/423 |
| 2012/0200294 | A1* | 8/2012 | Lazar | G01R 33/34046 324/318 |
| 2012/0286921 | A1* | 11/2012 | Wang | G01R 33/365 336/84 R |
| 2013/0314088 | A1* | 11/2013 | Wiggins | G01R 33/34092 324/322 |
| 2015/0260806 | A1* | 9/2015 | Yoo | G01R 33/3415 324/322 |
| 2017/0010338 | A1* | 1/2017 | Bayat | G01R 33/62 |

OTHER PUBLICATIONS

International Preliminary Report on Patentability dated Dec. 2, 2013.

International Search Report and Written Opinion dated Oct. 11, 2012.

* cited by examiner

ACQUISITION OF MR DATA WITH SEQUENTIAL SELECTION OF RESONANT MODES OF THE RF COIL ASSSEMBLY

CROSS-REFERENCE TO RELATED APPLICATION

This application is the 35 U.S.C. §371 national stage of PCT application PCT/IT2012/000159, filed May 30, 2012 which claims priority to Italian Patent Application No. RM2011000266, dated May 30, 2011, both of which are incorporated by reference in their entirety.

DESCRIPTION

The present invention relates to a magnetic resonance method and apparatus with sequential selection of resonant modes.

Magnetic resonance (MR) is a matter survey technique based on the measurement of the spin precession of protons or other cores provided with magnetic moment when in the presence of a static magnetic field and disturbed by an oscillating external magnetic field. Magnetic resonance in the medical field is widely used for diagnostic purposes in the so-called magnetic resonance imaging which is widely used in clinical and research applications with cells, tissues, organs and animal models. The standard MR clinical instrumentation currently operates at magnetic field values of 1.5 Tesla and it is estimated that more than 10,000 MR scanners are installed at hospitals and public and private research centres worldwide.

An essential hardware element for the acquisition of magnetic resonance signals produced by a sample to be analysed is the radiofrequency (RF) coil, tuned to a particular frequency of interest, which allows the nuclear spin signal generated by atoms or molecules of biological interest (for example the hydrogen contained in the water of the tissues) to be detected. The radiofrequency coil may be used in transmission or in reception. Moreover, there are magnetic resonance techniques wherein a same coil is sequentially used in transmission and in reception.

The literature related to magnetic resonance techniques highlights the need of sequentially or preferably simultaneously detecting the MR signal coming from two different cores belonging to molecules of biomedical interest. To this end, double-tuned RF coils have been used wherein two resonant modes of a same coil are tuned to two different Larmor frequencies of the two cores of interest for the observation. For example, such coils may be used for detecting the magnetic resonance signal of hydrogen (1H) to use for structural images, along with that of any other core X (13C, 17O, 19F, 23Na, 31P, 39K) for obtaining metabolic and/or functional information.

Examples of "multiple-tuned" radiofrequency coils that use surface or volume configurations belong to the prior art. The first ones are made on a planar or quasi planar surface and have a sensitivity region mainly located in the proximity of the same coil lying plane. Volume radiofrequency coils generally have a cylindrical or tubular shape with elliptical section and the sensitivity region is located in the central inner volume.

U.S. Pat. No. 7,119,541 describes multiple-tuned "birdcage" volume coils.

U.S. Pat. No. 5,557,247 describes TEM (Transverse-Electro-Magnetic) volume coils.

U.S. Pat. No. 4,742,304 describes some examples of multiple-tuned surface coils with concentrated parameter technology, suitable for low magnetic field (<3 T).

An example of double-tuned surface coil for preclinical high magnetic field (>3 T) applications is described in Alecci M et al, "*Practical design of a 4 Tesla double-tuned RF surface coil for interleaved 1H and 23Na MRI of rat head*", Journal of Magnetic Resonance, 181:203-211 (2006).

Italian patent application No. RM2007A000584 describes a triple-tuned TEM coil for magnetic resonance.

Italian patent application No. RM2007A000585 describes a multiple-tuned TEM surface coil for magnetic resonance.

In the prior art magnetic resonance acquisition techniques and apparatuses, the measurements related to a same sample are carried out strictly configuring in the construction and setup step the radiofrequency coil to be used in transmission and/or reception, so that it has a resonant mode that among those available is deemed by the man skilled in the art the most suitable one for magnetic resonance observations at a specific Larmor frequency. Magnetic resonance measurements are therefore strongly influenced by the spatial distribution of the sensitivity profile corresponding to the resonant mode selected by the man skilled in the art.

Document US 2008/0129296 describes a coil with conductive paths geometrically reconfigurable through switching elements. Therefore, a same coil may be used in different applications, based on the performance required by the specific applications in terms of signal to noise ratio or penetration depth. Once a configuration has been determined for an application, such configuration is kept fixed during the data acquisition in such application.

Document US 2009/0096553 describes a magnetic resonance antenna that only uses a single resonant mode for carrying out a method according to the preamble of the annexed claim 1.

Document WO 2009/105701 describes a multichannel transmitting and/or receiving coil and a multichannel receiving coil configurable between different operating modes, such as single tuned, double tuned, etc. Such document does not mention the possibility of acquiring magnetic resonance data from a sample observing a same resonance frequency of interest in two substeps of a same data acquisition from the sample using two resonant modes having different spatial field distributions and the possibility of combining the information acquired in a single image. The same applies to what described in document WO 2005/111645.

Document WO 2009/126767 describes a multiple coil system wherein a same and single resonant mode is used for resonating at different frequencies in order to acquire data related to different cores.

The object of the present description is to provide improved magnetic resonance method and apparatus capable of obviating the drawbacks described above with reference to the measurements dependence on the spatial distribution of the resonant mode selected for the acquisition.

Such object is achieved by a magnetic resonance method as defined in claim 1. Preferred and advantageous embodiments of said magnetic resonance method are defined in the annexed dependent claims.

The object of the present invention is also a magnetic resonance apparatus as defined in claim 13.

The invention shall be better understood from the following detailed description of specific embodiments thereof, made by way of a non-limiting example with reference to the annexed drawings, wherein.

In the figures, elements which are equivalent or similar will be indicated by the same reference numbers.

Figure 1:
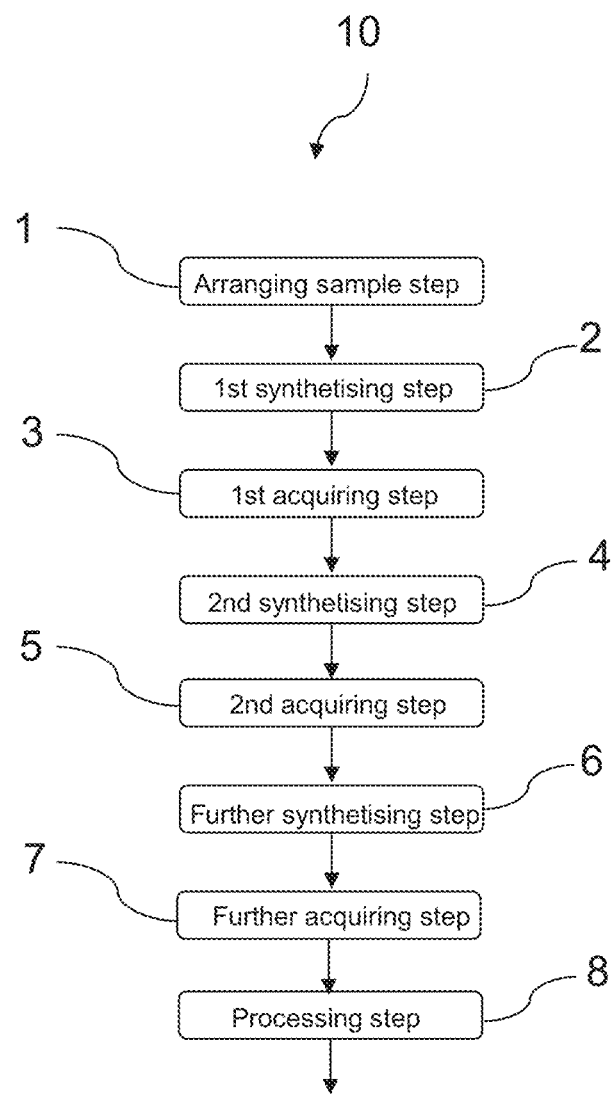
FIG. 1 shows a flow chart of an embodiment of a magnetic resonance method.

With reference to the flow chart of FIG. 1, reference numeral 10 globally indicates a method for acquiring magnetic resonance data.

Figure 3:
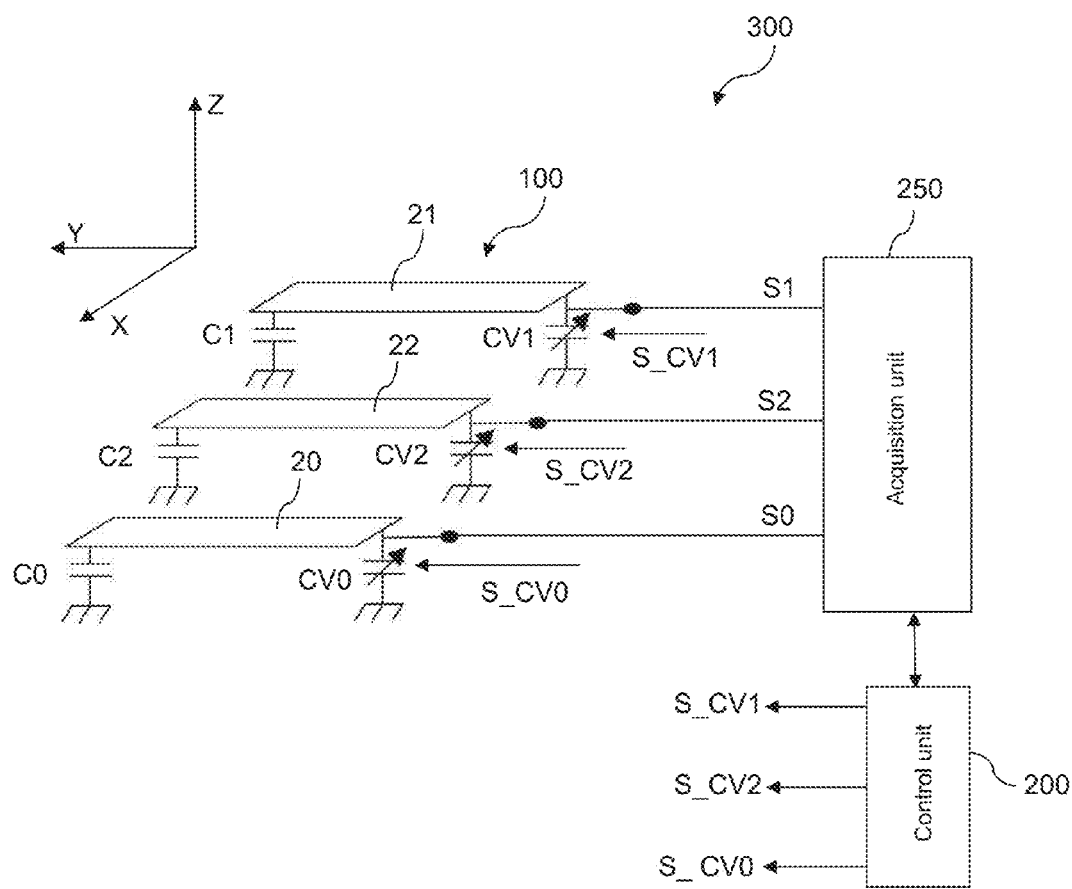
FIG. 3 shows a circuit scheme of an example of magnetic resonance apparatus that may be used in the process of FIG. 1 and comprising the coil of FIG. 2.

Such method 10 may be carried out, for example, without thereby introducing any limitation, using a magnetic resonance apparatus 300 schematically shown in FIG. 3 and comprising a transmission and/or reception system 250. For the purpose of clarity, before describing the acquisition method 10 in greater detail it is deemed appropriate to describe the magnetic resonance apparatus 300.

Figure 2:
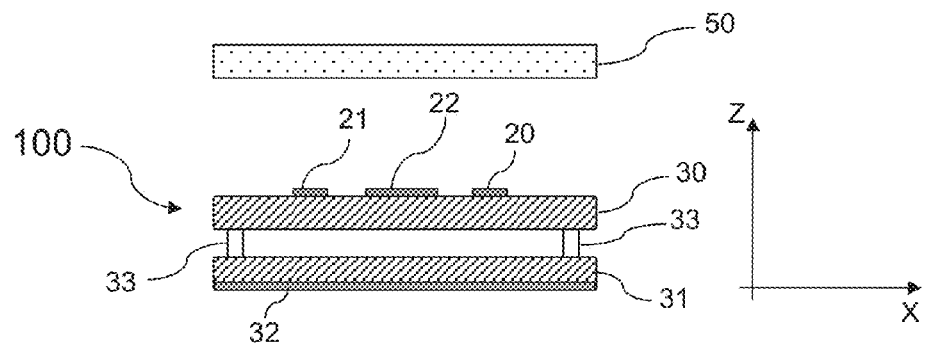
FIG. 2 shows a highly schematic flat and cross view of an example of radiofrequency coil that may be used in the process of FIG. 1.

With reference to FIGS. 2 and 3, the magnetic resonance apparatus 300 includes at least one radiofrequency coil 100 which for example is, without thereby introducing any limitation, a TEM surface coil of the type shown in FIG. 2, for example planar or quasiplanar. Some examples of TEM surface coils are described in the Italian patent application RM2007A000585. According to an embodiment, the TEM surface coil 100 of apparatus 300 is of the type substantially similar to the examples of radiofrequency coil described in said Italian patent application RM2007A000585 incorporated herein as a reference.

According to an alternative embodiment not shown in the annexed figures, the magnetic resonance apparatus 300 comprises a radiofrequency coil that rather than being a TEM surface coil is a volume coil, for example cylindrical or elliptical. Some examples of volume coils are described in the Italian patent application RM2007A000584. According to an embodiment, the volume coil 100 of apparatus 300 is of the type substantially similar to the examples of coil described in said Italian patent application RM2007A000584 incorporated herein as a reference.

In the particular example described, apparatus 300 comprises a single coil 100. In other embodiments, apparatus 300 may comprise more than one coil 300.

The radiofrequency coil 100 comprises a plurality of current elements 20, 21, 22. In the particular example described, the radiofrequency coil 100 comprises three current elements 20, 21, 22 but it is clear that such number is not limiting and the teachings of the present description are applicable to coils generally having a plurality of current elements. To a man skilled in the art of magnetic resonance it is clear that by "current element" it is generally meant a resonant transmission line.

According to an embodiment, the radiofrequency coil 100 is used in transmission only and is adapted to transmit radiofrequency signals adapted to excite sample 50. In this case, system 250 is a transmission system or better a system for supplying the coil and is adapted to provide the coil with power supply signals S0, S1, S2 such that coil 100 may irradiate radiofrequency signals adapted to excite sample 50 to be analysed. In this case another radiofrequency coil will be provided for detecting the magnetic resonance signals and an acquisition system connected to the latter coil.

Moreover, in said embodiment wherein coil 100 is used in transmission, the power supply system 250 provides output excitation signals S0, S1, S2 and comprises a generation system of suitably modulated radiofrequency pulses and a power amplification system of such pulses adapted to apply such excitation signals S0, S1, S2 to each current element 20, 21, 22 of coil 100.

According to a further embodiment, the radiofrequency coil 100 is used in reception only and is adapted to provide output magnetic resonance signals S0, S1, S2 detected. In this case, system 250 is an acquisition system and is adapted to receive supply signals S0, S1, S2 from coil 100. In this case another radiofrequency coil will be provided to be used in transmission and a power supply system connected to the latter coil.

According to a further embodiment, the radiofrequency coil 100 is used in both transmission and reception. In this case, system 250 is a system for supplying the coil and acquiring magnetic resonance data.

Hereinafter, for simplicity of description, reference shall be made to the case in which the radiofrequency coil 100 is used in reception only and system 250 is an acquisition unit.

Moreover, hereinafter in the present description reference shall be made to the particular example of radiofrequency coil 100 shown in FIGS. 2 and 3, without thereby introducing any limitation. Such radiofrequency coil 100 in particular comprises three current elements, whereof a central one 22 and two side ones 20, 21 each shaped as a microstrip of conductive material fixed to a first substrate of dielectric material 30, for example deposited on a face of the first substrate 30. The current elements 20, 21, 22 are suitably spaced apart from a common ground plane 32, in the example, without thereby introducing any limitation, fixed to a second substrate 31 spaced from the first substrate 30, for example deposited on a face of the second substrate 31. The two substrates 30, 31 are separate from each other by spacing elements 33.

The ground plane 32 may be continuously deposited onto substrate 31, as shown in FIG. 2, or it may have discontinuities along the longitudinal direction Y, discontinuities that may be suitably connected to each other by suitable electrical components, such as by way of an example capacitors.

The radiofrequency coil 100 exhibits a frequency response comprising a plurality of resonant modes, each associable, in conjunction or separated from the others, to a respective frequency of interest based on the electrical features of the current elements 20, 21, 22 and clearly also on the dielectric materials of substrates 30, 31, on the distance between said substrates and on the features of the ground plane 32.

The current elements 20, 21, 22 comprise at least one current element having electrical features that can be regulated based on a respective control signal S_CV0, S_CV1, S_CV2.

With reference to FIG. 3, in the particular example shown, the three current elements 20, 21, 22 have electrical features that can be regulated based on a respective control signal S_CV0, S_CV1, S_CV2. In alternative embodiments it is possible to provide for only one of the current elements 20, 21, 22 or only some of such current elements to have electrical features that can be regulated. In the specific non limiting example of FIGS. 2 and 3, each of the current elements 20, 21, 22 is in particular connected to the common ground plane 32 by a fixed capacity capacitor C0, C1, C2 and by a controllable capacity capacitor CV0, CV1, CV2 based on a control signal S_CV0, S_CV1, S_CV2. For this reason, the current elements 20, 21, 22 have electrical features that can be regulated through respective control signals S_CV0, S_CV1, S_CV2. For example, the three variable capacity capacitors CV0, CV1 and CV2 are varicaps and may be controlled by a respective control signal in the form of a control voltage S_CV0, S_CV1, S_CV2, synthesised and provided in output by a control unit 200. According to an embodiment, the control unit 200 is integrated in the acquisition unit 250.

In the particular example described, the adjustable electrical feature of the current elements is the impedance thereof, an in particular the reactive portion of the impedance thereof, which in the example is adjusted through variable capacity capacitors. It is clear that alternative embodiments are possible wherein the variation of the electrical features of the current elements, in particular aimed to regulate the resonance frequencies of the resonant modes of the coil, is carried out in a different way compared to the specific circuit example described wherein varicaps are used.

According to an embodiment, said control unit 200 is programmed for synthesising the control signals S_CV0, S_CV1, S_CV2 based on a feedback control.

According to an embodiment, the acquisition unit 250 comprises at least one preamplifier, not shown in the figures, provided for amplifying the magnetic resonance signals S0, S1, S2, at least one analogue to digital converter, not shown in the figures, provided for converting the magnetic resonance signals acquired S0, S1, S2 into digital samples and further comprises a memory unit, not shown in the figures, suitable for storing said digital samples. According to a further embodiment, the acquisition unit 250 further comprises a unit for processing said digital samples.

Figure 4A:
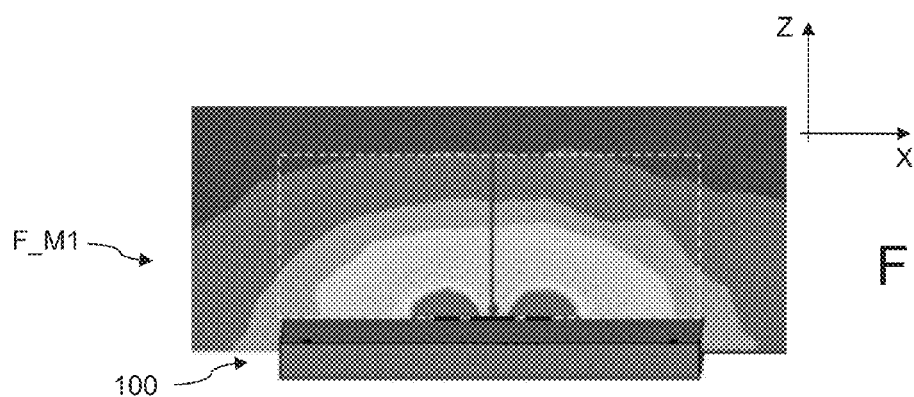
FIGS. 4a, 4b and 4c show diagrams of spatial distribution of a radiofrequency magnetic field simulated for different resonant modes of the coil of FIG. 2.
Figure 4B:
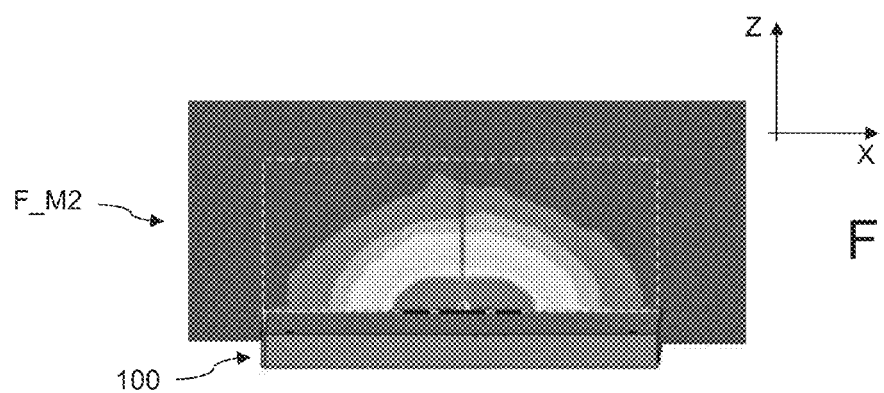
Figure 4C:
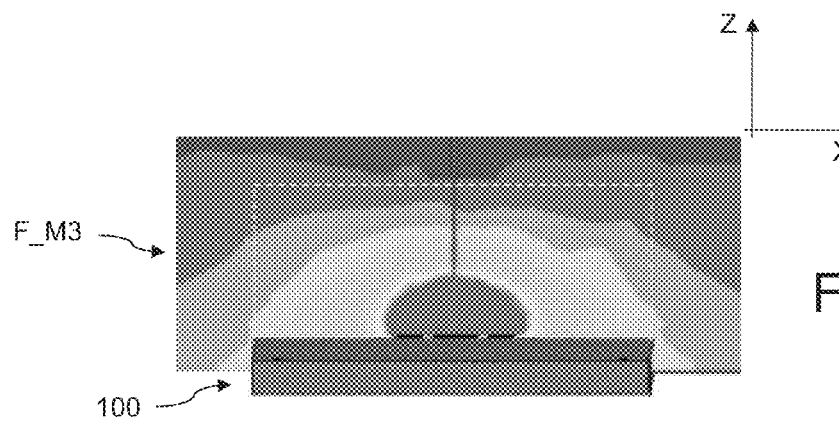

The radiofrequency coil 100 of the particular example described exhibits three resonant modes M1, M2, M3 potentially useful for magnetic resonance assays or surveys on sample 50. In the three-dimensional space, such modes M1, M2, M3 exhibit different spatial field distributions. FIG. 4a shows the spatial field distribution F_M1 in the cross plane X-Z of the first resonant mode M1 of the magnetic resonance coil 100. FIG. 4b shows the spatial field distribution F_M2 in the cross plane X-Z of the second resonant mode M2 of the magnetic resonance coil 100. FIG. 4c shows the spatial field distribution F_M3 in the cross plane X-Z of the third resonant mode M3 of the magnetic resonance coil 100. Based on the adjustable electrical features of the current elements 20, 21, 22 said three resonant modes are associable to respective resonance frequencies f1, f2, f3.

According to an embodiment, the plurality of resonant modes M1, M2, M3 comprises a first group G1 of resonant modes M1, M2 (for example comprising two modes) associable to a relatively lower resonance frequency and a second group G2 of resonant modes M3 (for example comprising a single mode M3) associable to a relatively higher resonance frequency.

In the particular embodiment wherein coil 100 is a coil with three current elements 20, 21, 22, a radiofrequency coil 100 has for example been made having a ground plane 32 of 19 cm×10 cm, with microstrip current elements 20, 21, 22 having a length of 19 cm, a width of about 1 cm for element 22 and 0.5 cm for elements 20, 21 and arranged at about 1 cm distance from each other and arranged at 5 cm from the ground plane 32. The two side current elements 20, 21 through the respective control signals S_CV0, S_CV1 may be configured for producing two relatively lower resonance frequencies f1 and f2 (f1<f2), whereas the central one may be configured for being tuned to a relatively higher resonance frequency f3 (f2<f3) with respect to frequencies f1, f2. For example, the first mode M1 is used for detecting the signal of core X, for example sodium, the second mode M2 is not used and the third mode M3 is used for detecting the signal of proton 1H. For example, if we consider another magnetic field $B_0$ equal to 9.4 T, and if the cores of interest are sodium and proton, for the frequencies of each mode we shall have f1=105 MHz (sodium detection 23Na), f2=126 MHz (not used), f3H=400 MHz (sodium detection 1H). In the prior art magnetic resonance techniques, mode M2 is considered to be spurious and is not used for detecting the magnetic resonance signal. It should be noted that the first group G1 is characterised by resonance frequencies of modes M1, M2 relatively close to each other and relatively far away from the resonance frequency of mode M3 of the second group G2.

Advantageously, the control unit 200, through the control signals S_CV0, S_CV1, S_CV2 allows the electrical features of the current elements 20-22 to be regulated so as to configure the radiofrequency coil 100 in relatively short times (for example in the order of one microsecond) so as to carry out two sequential acquisitions (or one acquisition divided into two consecutive sub-acquisitions) such that:

in a first acquisition (or in a first sub-acquisition) the first mode M1 is characterised by a resonance frequency f1 tuned by the control unit 200 to a first frequency of interest for example useful for capturing the signal of core X, for example sodium, the second mode M2 is not used and the third mode M3 is characterised by a resonance frequency f3 tuned by the control unit 200 to a second frequency of interest for example useful for capturing the signal of proton 1H;

in a second acquisition (or in a second sub-acquisition) the first mode M1 is not used whereas the current elements are regulated so that the second mode M2 is characterised by a resonance frequency f2 tuned by the control unit 200 to said first frequency of interest (in the example the Larmor frequency useful for capturing the signal of core X, in the example sodium), the third mode M3 is characterised by a resonance frequency f3 tuned by the control unit 200 to a second frequency of interest for example useful for capturing the signal of proton 1H.

The control unit 200 therefore allows making a sequential selection of the resonant modes associated to a same frequency of interest, with switching times as fast as desired.

The signals sequentially acquired in said two acquisitions may for example be converted into digital samples by the acquisition unit 250 and stored to the memory unit. The acquisitions related to the first frequency of interest carried out using modes M1 and M2 may then be compared with each other for understanding which field distribution is more useful for the required analysis or they may be combined with each other, for example by digital processing, to have more complete resonance information compared to information acquired using a single resonant mode for capturing a resonance frequency of interest.

In the example described above, the third mode M3 is used for a simultaneous acquisition of a further frequency of interest (in the example relatively high) in both said two acquisitions. Of course it is possible to configure the radiofrequency coil 100 by the control unit 200 so that in one of said two acquisitions the resonant mode M3 is not used. In a further embodiment, the simultaneous acquisition of a further frequency of interest using a fixed resonant mode in addition to that which is the object of the two sequential acquisitions with different spatial distribution modes may not be provided.

In general, besides the specific exemplary case described above, it is also possible to provide for the control unit 200 to be suitable/programmed for configuring the radiofrequency coil 100 for carrying out sequential acquisitions of a same frequency of interest by apparatus 300 using more than two resonant modes of coil 100 available for acquiring said frequency, varying said modes at each acquisition. For each of the frequencies of interest, such available resonant modes depend on the features of the radiofrequency coil 100 and may also be more than two, for example three, four, etc.

Moreover, it is possible that in each of said sequential acquisitions two (or more) frequencies of interest are acquired at each step, varying at each subsequent acquisition the resonant modes each time associated to the frequencies of interest.

With reference to FIG. 1, a method 10 for acquiring magnetic resonance data from a sample 50 to be analysed shall now be described. The method described shall in particular be limited to the specific case wherein coil 100 is used in reception without thereby introducing any limitation as regards the use of the coil in transmission or both in transmission and in reception.

The acquisition method 10 comprises a step 1 of arranging sample 50 to be analysed in the proximity of the radiofrequency coil 100. As already described above, coil 100 in the case is suitable for detecting magnetic resonance signals from the sample and comprises a plurality of current elements 20,21,22. Coil 100 exhibits a frequency response comprising a plurality of resonant modes M1, M2, M3 each associable to a respective resonant frequency f1,f2,f3 depending on the electrical features of the current elements 20,21,22. The current elements 20,21,22 comprise at least one current element having electrical features that can be regulated based on a respective control signal S_CV0, S_CV1, S_CV2.

The acquisition method 10 comprises a first step of synthesising 2 through the control unit 200 a first control signal S_CV0, S_CV1, S_CV2 and providing said signal to said at least one current element 20,21,22 with adjustable electrical features for regulating such features so that coil 100 takes on a first configuration such that at least a first resonant mode M1 of the coil is tuned on a first frequency of interest. According to an embodiment, such frequency of interest is the Larmor frequency of the core of a chemical element other than hydrogen 1H, for example one of the following chemical elements: 13C, 17O, 19F, 23Na, 31P, 39K.

The acquisition method 10 comprises, after said first step of synthesising 2, a first step 3 of acquiring, in this example through coil 100 in said first configuration, a first magnetic resonance signal S0, S1, S2 from said sample 50.

The acquisition method 10 further comprises, after said step of acquiring 3, a second step of synthesising 4 through the control unit 200 a second control signal S_CV0, S_CV1, S_CV2 and providing said second signal to said at least one current element 20,21,22 for regulating the electrical features thereof so that coil 100 takes on a second configuration such that a second resonant mode M2 of the coil is tuned on said first resonant frequency of interest. The second resonant mode M2 is characterised by a spatial field distribution different from the spatial distribution of the first resonant mode M1.

The acquisition method 10 further comprises, after said second step of synthesising 4, a second step 5 of acquiring, in this example through coil 100 in said second configuration, a second magnetic resonance signal S0, S1, S2 from sample 50.

According to an embodiment, the acquisition method 10 further comprises a processing step 8 for obtaining magnetic resonance data of sample 50, for example by integrating or combining or comparing information carried by said first and second magnetic resonance signals.

According to an embodiment, the steps of synthesising 2 and providing 2 and 4 are automatically carried out by the control unit 200 based on a feedback control.

According to an embodiment, each of said steps of acquiring 3 and 5 comprises:
  an operation of carrying out a conversion from analogue to digital of the respective magnetic resonance signal for obtaining a plurality of digital samples;
  an operation of storing said plurality of digital samples. For example, such operations are carried out through the acquisition unit 250.

As already described above, according to an embodiment the at least one current element 20,21,22 having electrical features that can be regulated based on the respective control signal S_CV0, S_CV1, S_CV2, comprises a plurality of current elements having features that can be regulated based on respective electrical control signals. In this case, said steps 2 and 4 of synthesising the first control signal C S_CV0, S_CV1, S_CV2 and the second control signal S_CV0, S_CV1, S_CV2 are such as to synthesise a first plurality of control signals and a second plurality of control signals respectively to be sequentially provided to the plurality of current elements 20,21,22 respectively in the first 3 and a second 5 step of acquisition for carrying out the acquisition of the first and of the second magnetic resonance signal, respectively. It should be noted that the coil has a fixed geometrical configuration, since the geometrical paths of the currents or of the current elements do not change during the first and the second step but only the control signals do. It should further be noted that the current elements are all simultaneously used during the first and the second step of acquisition, only the control signals changing between the two steps.

As already described above, according to an embodiment the plurality of resonant modes comprises a first group G1 of resonant modes M1, M2 suitable for resonating at a relatively lower resonance frequency and a second group G2 of resonant modes M3 intended for resonating at a relatively higher frequency. According to an embodiment, the first M1 and second mode M2 in this case belong to the first group of resonant modes. For example, the first mode M1 and the second mode M2 are both tuned in the first and in the second step of acquiring, respectively, so that the resonance frequency thereof is tuned to the Larmor frequency of the core of a chemical element other than hydrogen 1H, for example one of the following chemical elements: 13C, 17O, 19F, 23Na, 31P, 39K. Moreover, according to an embodiment, in one or both steps of acquiring 3 and 5 it is possible to carry out a multiple simultaneous acquisition, for example if coil 100 has such frequency response that a third resonant mode M3 of the second group is tuned to a second frequency of interest. For example, the second frequency of interest is the Larmor frequency of hydrogen 1H.

If coil 100 has more than two resonant modes M1, M2 associable to a frequency of interest through the control unit 200, it is possible for the acquisition method 10 to provide for:
  at least one further step 6 of synthesising through the control unit 200 a further control signal and providing said further signal to said at least one current element for regulating the electrical features thereof so that coil 100 takes on a respective further configuration such that a further resonant mode of the coil is tuned on said first resonant frequency of interest, the further resonant mode being characterised by a spatial field distribution different from the spatial distributions of the first and of the second resonant mode;

at least one further step 7 of acquiring, in this example through coil 100 in said further configuration, a further magnetic resonance signal from sample 50.

In the above description it is possible to understand how a magnetic resonance acquisition method and apparatus as described above are such as to fully achieve the intended objects.

With a magnetic resonance method and apparatus as described above it is in fact possible, for example, to advantageously use in a sequential manner, with very fast switching times, even all the low frequency resonant modes for detecting the magnetic resonance signal of core X, and also all the high frequency modes for the proton signal. This allows the field of vision (FOV) wherefrom the signal of the sample being examined (or for transmitting the radiofrequency pulses) to be regulated as desired, with advantages in both the possibility of spatial selection and in the increase of the signal to noise ratio measurable in a particular spatial region of the sample. The described approach is also applicable for making devices with a larger FOV compared to what can currently be obtained based on the prior art methodologies, since by combining the signal of multiple different modes it is possible to increase the field of vision of the current analysis without having to move the sample and/or the receiver.

It should be noted that the method and the apparatus described above are especially advantageous if the radiofrequency coil has an open, planar or quasiplanar TEM configuration that allows easy access to the sample being analysed and this is particularly useful in clinical applications. In fact for said configurations, radiofrequency coils, especially with multiple frequencies, typically exhibit reduced FOV for each mode and a non perfect spatial matching between the FOV related to the main core and those related to the secondary cores (if there is more than one). With the fast and sequential switching between the resonant modes it is possible to exceed such limitations and obtain information related to multiple cores for the same region of interest.

A further advantage of the above approach is given by the possibility of using the different modes related to a same frequency of interest also in radiofrequency pulse transmission mode, therefore using the radiofrequency coil 100 in transmission, thereby allowing the implementation of a variant of the mode described in the literature as parallel transmission imaging (transmit SENSE). In fact, following the above approach it is possible to use the various relative modes sequentially tuned to a same frequency of interest as if they were separate coils that transmit their signal in a fast succession. This allows, for example, the artefacts due to the radiofrequency lacks of homogeneity to be reduced, which are present at a high field when biological samples are examined.

It is clear that a man skilled in the art may make several changes and variations to the magnetic resonance method and apparatus described above in order to meet specific and incidental needs, all falling within the scope of protection of the invention as defined by the following claims.

The invention claimed is:

1. A method for acquiring magnetic resonance data from a sample to be analysed, comprising:
   a step of arranging the sample in a proximity of at least one radiofrequency coil, said at least one coil being a fixed geometric configuration coil adapted to transmit radiofrequency signals adapted to excite said sample and/or detect magnetic resonance signals from the sample, the coil comprising a plurality of current elements and exhibiting a frequency response comprising a plurality of resonant modes each one associable to a respective resonant frequency depending on electrical features of the current elements, the current elements comprising at least one current element having electrical features that may be regulated based on a respective control signal;
   a first step of synthesising through a control unit a first control signal and providing said signal to said at least one current element for regulating the electrical features thereof so that the at least one coil takes on a first configuration such that the resonant frequency of at least a first resonant mode of the coil is tuned on a first resonant frequency of interest;
   a first step of acquiring, using the coil in transmission and/or in reception, a first magnetic resonance signal from the sample;
   said method being characterised in that it comprises:
   a second step of synthesising through the control unit a second control signal and providing said second signal to said at least one current element for regulating the electrical features thereof so that the at least one coil takes on a second configuration such that the resonant frequency of a second resonant mode of the coil is tuned on said first resonant frequency of interest, the second resonant mode being characterised by a spatial field distribution different from a spatial distribution of the first resonant mode;
   a second step of acquiring, using the coil in transmission and/or in reception, a second magnetic resonance signal from the sample,
   said method being therefore such as to obtain magnetic resonance data from a same sample for said same first resonant frequency of interest sequentially using resonance modes having different spatial field distributions; and
   wherein in the first configuration and in the second configuration of the radiofrequency coil, geometrical paths of currents in said coil do not change.

2. The method according to claim 1, further comprising a step of obtaining magnetic resonance data of the sample integrating or combining or comparing information carried by said first and said second magnetic resonance signals.

3. The method according to claim 2, wherein each of the steps of acquiring comprises:
   an operation of carrying out a conversion from analogue to digital of the respective magnetic resonance signal for obtaining a plurality of digital samples; and
   an operation of storing said plurality of digital samples.

4. The method according to claim 1, wherein said at least one current element having electrical features adapted to be regulated based on a respective control signal, comprises a plurality of current elements having features adapted to be regulated based on respective electrical control signals, and wherein the steps of synthesising the first and the second control signal are such as to respectively synthesise a first plurality of control signals and a second plurality of control signals to be sequentially provided to said plurality of current elements for respectively carrying out the step of acquiring the first and of the second magnetic resonance signal, said current elements being all simultaneously used during the step of acquiring the first and second magnetic resonance signal.

5. The method according to claim 1, wherein the plurality of resonant modes comprises a first group of resonant modes adapted to resonate at a relatively lower frequency of interest and a second group of resonant modes intended to resonate at a relatively higher frequency of interest, and wherein said first and second mode belong to the first group of resonant modes.

6. The method according to claim 5, wherein in the first and second configuration the at least one coil exhibits a frequency response such that a third resonant mode of said second group is tuned to a second frequency of interest.

7. The method according to claim 1, wherein the first frequency of interest is a Larmor frequency of a core of a chemical element other than hydrogen 1H.

8. The method according to claim 1, wherein said second frequency of interest is a Larmor frequency of hydrogen 1H.

9. The method according to claim 1, further comprising, after the second step of acquiring:
at least one further step of synthesising through the control unit a third control signal and providing said third signal to said at least one current element for regulating the electrical features thereof so that the radiofrequency coil takes on a respective further configuration such that a further resonant mode of the coil is tuned on said first resonant frequency of interest, the further resonant mode being characterised by a spatial field distribution different from the spatial distributions of the first and of the second resonant mode; and
at least one further step of acquiring, in said further configuration, a further magnetic resonance signal from the sample.

10. The method according to claim 1, wherein said steps of synthesising and providing to the current elements such control signals are automatically carried out by the control unit based on a feedback control.

11. The method according to claim 1, wherein the radiofrequency coil is a surface coil.

12. The method according to claim 1, wherein the radiofrequency coil is a volume coil.

13. The method according to claim 1, wherein said at least one current element comprises at least one capacitor that may be electronically regulated based on the control signal.

14. An apparatus for acquiring magnetic resonance data from a sample to be analysed, comprising:
at least one radiofrequency coil, the coil being a fixed geometric configuration coil adapted to detect magnetic resonance signals from the sample, the coil comprising a plurality of current elements and exhibiting a frequency response comprising a plurality of resonant modes each associable to a respective resonant frequency depending on electrical features of the current elements, the current elements comprising at least one current element having electrical features that are adapted to be regulated based on a respective control signal,
a control unit programmed for synthesising a first control signal and providing said signal to said at least one current element for regulating the electrical features thereof so that the at least one coil takes on a first configuration such that the resonant frequency of at least a first resonant mode of the coil is tuned on a first resonant frequency of interest, for allowing the apparatus to acquire, through the coil in said first configuration and used in transmission/reception, a first magnetic resonance signal from the sample;
characterised in that said control unit is programmed for synthesising also a second control signal and providing said second signal to said at least one current element for regulating the electrical features thereof so that the coil takes on a second configuration such that the resonant frequency of a second resonant mode of the coil is tuned on said first resonant frequency of interest, to allow the apparatus to acquire, through the coil in said second configuration and used in transmission and/or in reception, a second magnetic resonance signal from the sample, the second resonant mode being characterised by a spatial field distribution different from a spatial distribution of the first resonant mode; so as to obtain magnetic resonance data from a same sample for said same first resonant frequency of interest sequentially using resonant modes having different spatial field distributions; and
wherein in the first configuration and in the second configuration of the radiofrequency coil, geometrical paths of currents in said coil do not change.

15. The apparatus according to claim 14, wherein the apparatus allows for obtaining magnetic resonance data of the sample integrating or combining or comparing information carried by said first and said second magnetic resonance signals acquired.

16. The apparatus according to claim 15, wherein the apparatus comprises:
an analogue to digital converter suitable for carrying out a conversion from analogue to digital of said magnetic resonance signals acquired for obtaining a plurality of digital samples; and
a memory unit suitable for storing said plurality of digital samples.

17. The apparatus according to claim 14, wherein said at least one current element having electrical features that are adapted to be regulated based on a respective control signal, comprises a plurality of current elements having features that are adapted to be regulated based on respective electrical control signals, and wherein the control unit is such as to respectively synthesise a first plurality of control signals and a second plurality of control signals to be sequentially provided to the plurality of current elements for allowing the apparatus to respectively carry out an acquisition of the first and of the second magnetic resonance signal, said current elements being all used during the acquisition of the first and second magnetic resonance signal.

18. The apparatus according to claim 14, wherein the plurality of resonant modes comprises a first group of resonant modes adapted to resonate at a relatively lower frequency and a second group of resonant modes intended to resonate at a relatively higher frequency, and wherein said first and second mode belong to the first group of resonant modes.

19. The apparatus according to claim 14, wherein the control unit is such as to synthesise said first and second signal based on a feedback control.

20. The apparatus according to claim 14, wherein the radiofrequency coil is an open surface coil.

21. The apparatus according to claim 14, wherein the radiofrequency coil is a volume coil.

22. The apparatus according to claim 14, wherein said at least one current element comprises at least one adjustable capacitor that is adapted to be electronically regulated based on said control signal.

23. The apparatus according to claim 22, wherein said adjustable capacity comprises a varicap, and wherein said control signal is a voltage control signal.

* * * * *